United States Patent [19]

Singer, Jr.

[11] Patent Number: 4,741,711

[45] Date of Patent: May 3, 1988

[54] MODULAR DISTRIBUTION FRAME INCLUDING PROTECTOR MODULES ADAPTED FOR BREAK ACCESS TESTING

[75] Inventor: Loren A. Singer, Jr., Minneapolis, Minn.

[73] Assignee: ADC Telecommunications, Inc., Minneapolis, Minn.

[21] Appl. No.: 917,232

[22] Filed: Oct. 6, 1986

Related U.S. Application Data

[63] Continuation-in-part of Ser. No. 740,804, Jun. 3, 1985, abandoned.

[51] Int. Cl.[4] ............................................. H01R 13/06
[52] U.S. Cl. .................................. 439/620; 361/119; 439/92
[58] Field of Search ................... 361/119; 339/147 R, 339/14 R; 439/92, 620–622, 405, 406

[56] References Cited

U.S. PATENT DOCUMENTS

| | | | |
|---|---|---|---|
| 3,778,750 | 12/1973 | Caveney et al. | 439/392 |
| 4,146,755 | 3/1979 | Caussé | 361/119 X |
| 4,150,867 | 6/1979 | Knickerbocker | 439/402 |
| 4,163,596 | 8/1979 | Aysta et al. | 439/405 |
| 4,210,370 | 7/1980 | Vachhani et al. | 303/108 |
| 4,236,778 | 12/1980 | Hughes et al. | 439/406 |
| 4,255,009 | 3/1981 | Clark | 439/398 |
| 4,283,105 | 8/1981 | Ferrill et al. | 439/406 |
| 4,286,836 | 9/1981 | Rumps | 439/406 |

OTHER PUBLICATIONS

"MDF: Planning & Engineering Guidelines", Bell System, Aug. 1976.

Primary Examiner—Eugene F. Desmond
Attorney, Agent, or Firm—Merchant, Gould, Smith, Edell, Welter & Schmidt

[57] ABSTRACT

A modular distribution frame is disclosed which includes a module block having first and second parallel opposing rows of wire connectors. Apertures in the block provide access to the connectors. The wire connectors have a wire terminating end and a spring contact finger end. The spring contact finger end of opposing connectors extend into the apertures in releasable electrical contact. An overload protector element is provided adaptable for insertion into the aperture and extending between opposing spring fingers to electrically separate the fingers. The overload protector element includes circuitry to provide electrical connection between the opposing wire connectors through the element.

13 Claims, 8 Drawing Sheets

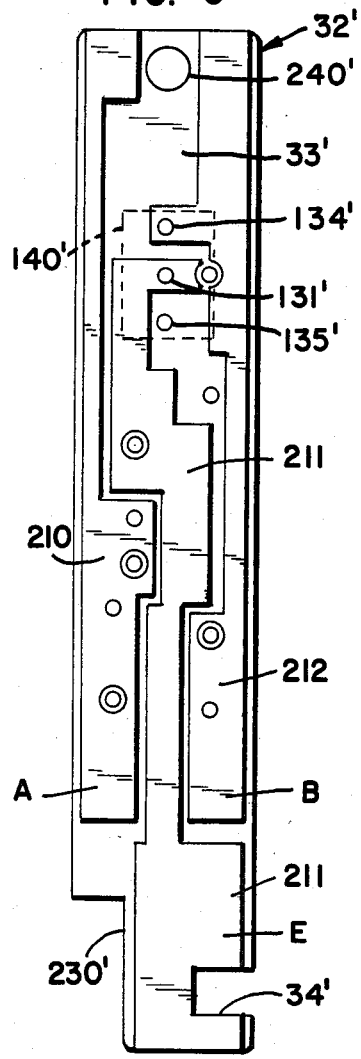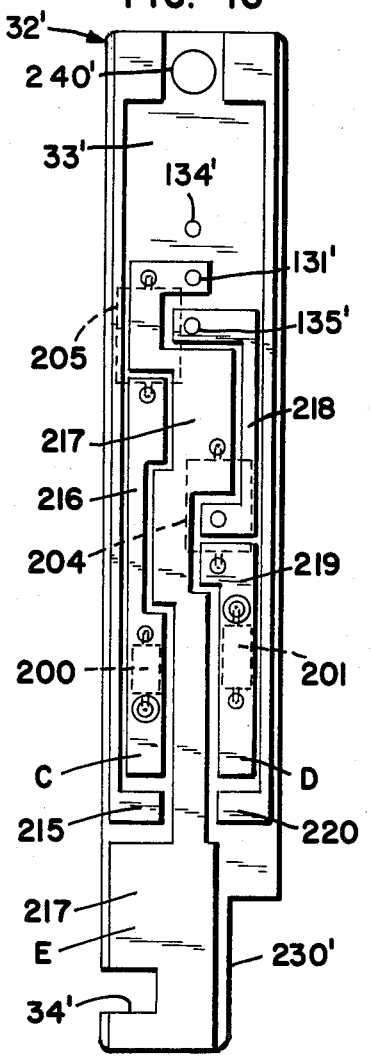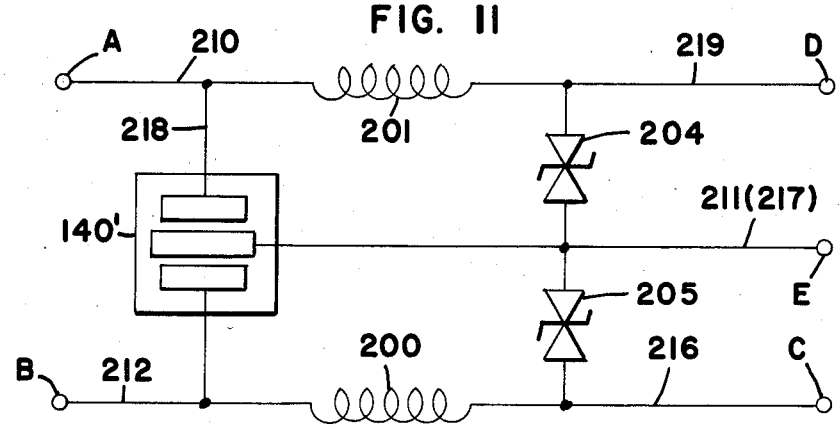

MODULAR DISTRIBUTION FRAME INCLUDING PROTECTOR MODULES ADAPTED FOR BREAK ACCESS TESTING

This is a continuation-in-part of application Ser. No. 740,804, filed June 3, 1985, now abandoned.

TECHNICAL FIELD OF THE INVENTION

The present invention pertains generally to the field of telecommunications, and more particularly to the structure of distribution frames for distributing or cross-connecting incoming telecommunication lines, and overload protectors and test access features for such lines.

BACKGROUND OF THE INVENTION

Distribution frames typically provide that selected incoming or outgoing lines can be "protected", such that internal equipment lines are protected from overvoltage and/or overcurrent conditions. To this end a typical distribution module includes a first "side" for connection to outside lines and a second "side" for connection to internal equipment, with means for connecting and/or protecting the corresponding individual wire connectors on opposing sides. Besides connecting and protecting lines frames are also used as test-points for lines, whereby outside and inside lines and connections may be monitored and tested.

With regard to protection it is desirable that a distribution frame be both flexible as to the kinds of protection it can provide and modular such that protection capacity may be implemented in close accordance with need. With regard to wiring and cross-connection it is of course desirable that access to wire connectors is free and easy, and that connection operations may be accomplished quickly. Last, but not least, it is desirable that a distribution frame accommodate and preferably facilitate the monitoring and testing of lines.

SUMMARY OF THE INVENTION

The present invention provides a distribution frame which is modular with respect to both distribution and protection capacity and which may be readily adapted to provide different kinds of overload protection, for instance overvoltage and/or overcurrent protection. In addition, the frame of the present invention permits free and easy access to wire connectors and for one-step connection of inside and outside lines thereto. Moreover, the distribution frame according to the present invention provides that inside and outside lines may be readily contacted for testing, and that connections may be readily interrupted for break access testing.

To the above end the distribution frame according to the present invention includes a U-shaped mounting bracket including pairs of mounting tabs with each pair adapted to accept an individual frame module via which connections and protection is provided. Each distribution frame module comprises a generally rectangular module block having a front face and including first and second parallel opposing rows of wire connectors supported therein and accessible through connector apertures in said front face. A row of protector apertures is disposed between the first and second wire connector rows, with the protector apertures adapted for accepting overload protector elements. Each of the wire connectors includes a wire terminating end and a spring contact finger end with the spring contact finger end of corresponding opposing connectors extending into one of the protector apertures. In the absence of a protector element in a protector aperture the corresponding opposing spring fingers of wire connectors extend to make electrical connection with each other. An overload protector element adaptable for insertion in a protector aperture between spreaded opposing spring fingers is provided. The elements have at least two external contacts each for making contact with one of the spring fingers. According to one aspect of the invention the external contacts are electrically connected on the protector elements such that a connection between corresponding opposing wire connectors is provided. According to another aspect of the invention a protector element includes overvoltage protection means between the external contacts and a ground, whereby an outside line contacting one of said external contacts is protected.

According to the test access features of the present invention an end portion of each protector element extends away from the module face and includes an electrical probe contact at said end, with the contact being in electrical communication with at least one wire connector. Accordingly, outside and inside lines may be accessed readily for testing above the face of the module. According to yet another aspect of the testing features according to the present invention, there is provided first and second protector elements positions in said protector apertures, a first one of said positions providing for normal connection between corresponding pairs of wire connectors and protection therefor, with the second position thereof providing for a break in the connection between corresponding conductors while maintaining overvoltage protection on the outside lines. In addition, this "break access" testing capability provides that each individual wire connector interfaced with a protector element in the break access testing position may be tested or monitored via a corresponding probe contact at the end of the element extending out from the face of the distribution module. These and other salient features of the invention, together with other advantages which result from various classes of embodiments, are described below in more detail in the following specification and drawings.

BRIEF DESCRIPTION OF THE DRAWINGS

FIGS. 9 and 10 are corresponding side elevations showing either side of a printed circuit board protector element according to another aspect of the present invention;

FIG. 11 is a schematic showing the electrical components preferably employed in connection with the protector element shown in FIGS. 9 and 10;

DETAILED DESCRIPTION OF THE INVENTION

Figure 1:
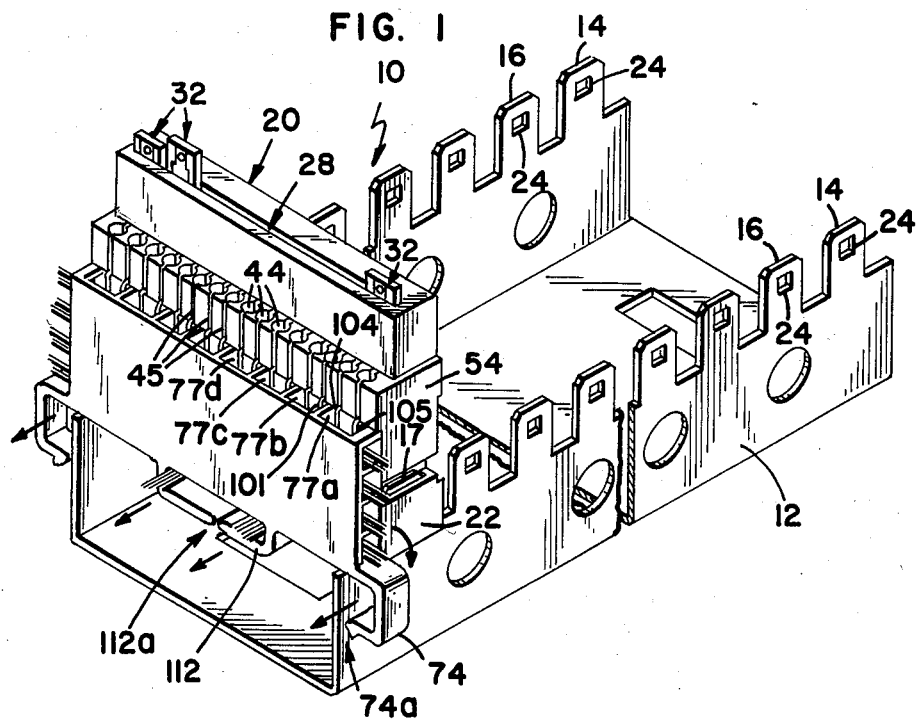
FIG. 1 is a perspective view showing one form of bracket to be used with a number of modules of the present invention, one of which is shown assembled to the bracket.

Referring now to the drawings, the preferred embodiment of the distribution frame according to the present invention will be described. Referring to FIG. 1, there is shown a perspective view of the basic components of the distribution frame 10 according to the present invention. Distribution frame 10 is made up of a U-shaped mounting bracket 12, with the legs of the "U" having individual pairs of mounting tabs, two pairs of which are labeled 14,14 and 16,16 respectively. Each pair of mounting tabs accepts an individual module, with preferably ten pairs provided to accept a total of ten individual distribution frame modules.

Figure 4:
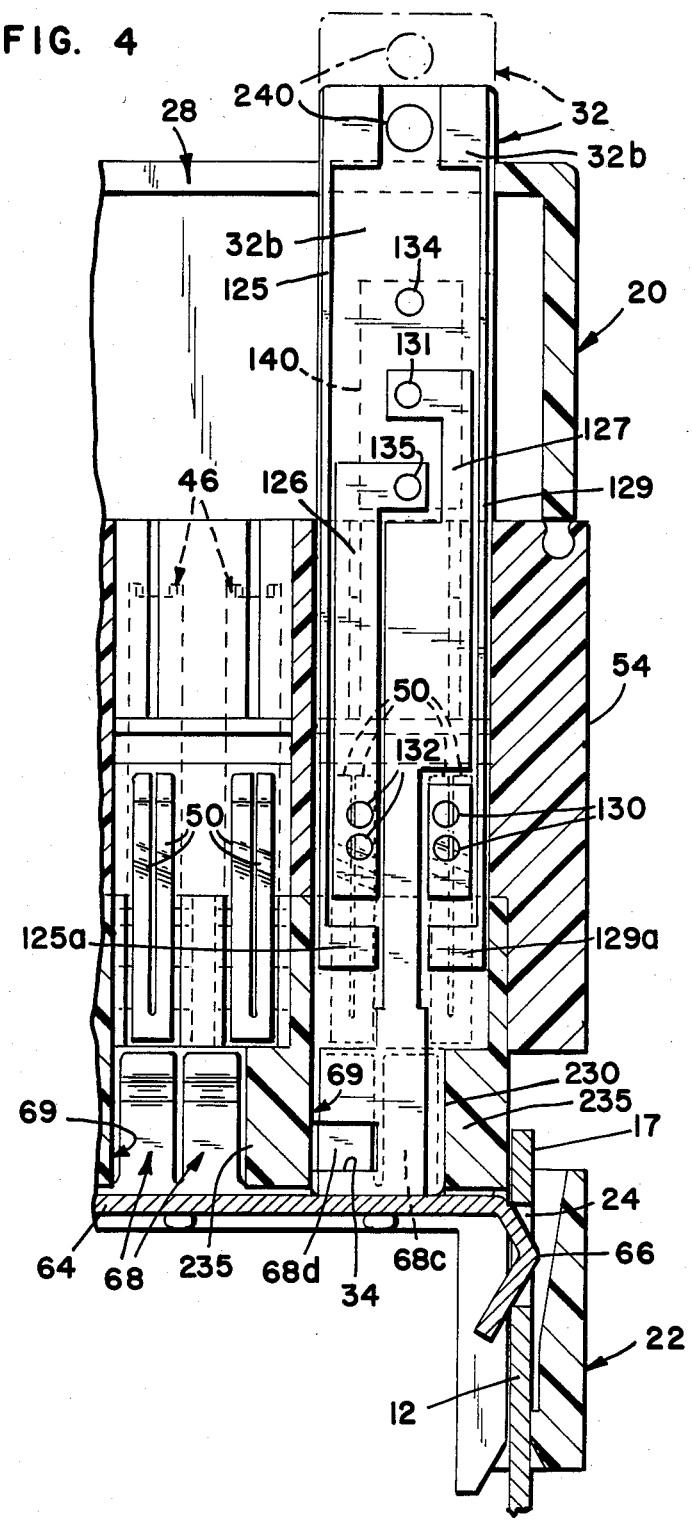
FIG. 4 is an enlarged sectional view taken along the lines 4—4 of FIG. 2.

Shown mounted on bracket 12 is a distribution module generally designed 20. Distribution module 20 is a structure having a pair of individual mounting sleeves 22 on opposite ends thereof, each of which is adapted to receive one mounting tab of bracket 12. As exemplified by the pair of mounting tabs 14, each mounting tab has a locking aperture 24. As part of the structure of module 20, there is incorporated along the base thereof a metallic ground strip 64 which includes on each end thereof a mounting clip 66 which, as shown in FIG. 4, cooperates with a locking aperture in a tab (17) in order to secure the module 20 to the bracket 12.

The distribution module 20 as shown in FIG. 1 would, under ordinary circumstances, be one of ten such modules which would be aligned across associated pairs of mounting tabs on bracket 12. Each such module 20 has a front face 28 on which connections to distribution lines and equipment are made. Front face 28 also accepts individual protector elements, as shown more particularly in FIGS. 2, 3, 4, and 5.

Referring now to FIGS. 2, 3, 4 and 5 in addition to FIG. 1, there is shown various views of the detailed structure of a module 20 and of an exemplary protector element 32 as inserted in module 20. With reference first to the structure of module 20, it includes a body portion 54 supporting two parallel rows of insulation displacement connectors 46 in apertures 44. An individual one of said connectors is labeled 46a (see FIG. 5 in particular) and includes an upper cylindrical portion 48 and a pair of contact extensions or spring fingers 50 which extend longitudinally away from cylindrical portion 48 to an elbow and then extend back toward cylindrical portion 48 in a radially displaced relationship therewith. The upper cylindrical portion of connector 46a is preferably configured to accept more than one wire. An example of such structure is shown in the application assigned to the same assignee, filed in the name of Vasantrai Vachhani, as inventor, filed on Feb. 26, 1985 and issued on Nov. 25, 1986 as U.S. Pat. No. 4,624,521.

Figure 8:
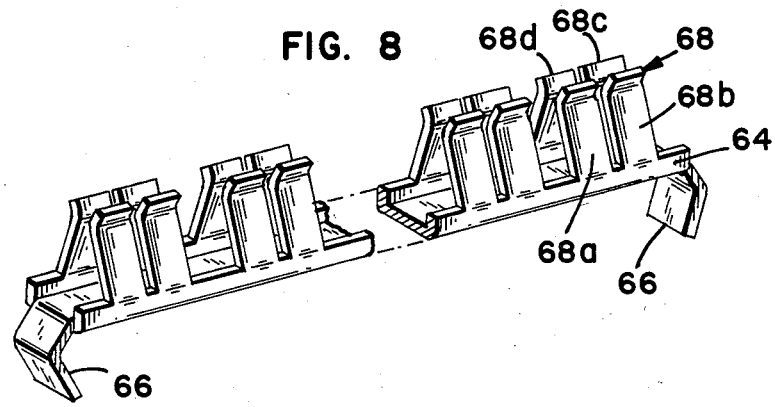
FIG. 8 is an enlarged perspective view of the ground strip structure mounted in a module.

Thus, the module 20 includes two parallel rows of symmetrically opposing insulation displacement connectors each including connector spring fingers 50. In addition, as mentioned above, ground strip 64 is disposed internally of body 54 in a recess or cavity which includes for each group of four wire connectors 46 (e.g. 46a, 46b, 46c, 46d) a space 69 for a set of four grounding clips 68, with one exemplary group shown in FIG. 8 as clips 68a, 68b, 68c, and 68d. Although there are only four sets of grounding clips shown in FIG. 8, it shall be understood that there is provided one set (four) of grounding clips 68 for every four insulation displacement connectors, as shown particularly in FIGS. 4 and 5.

Figure 3:
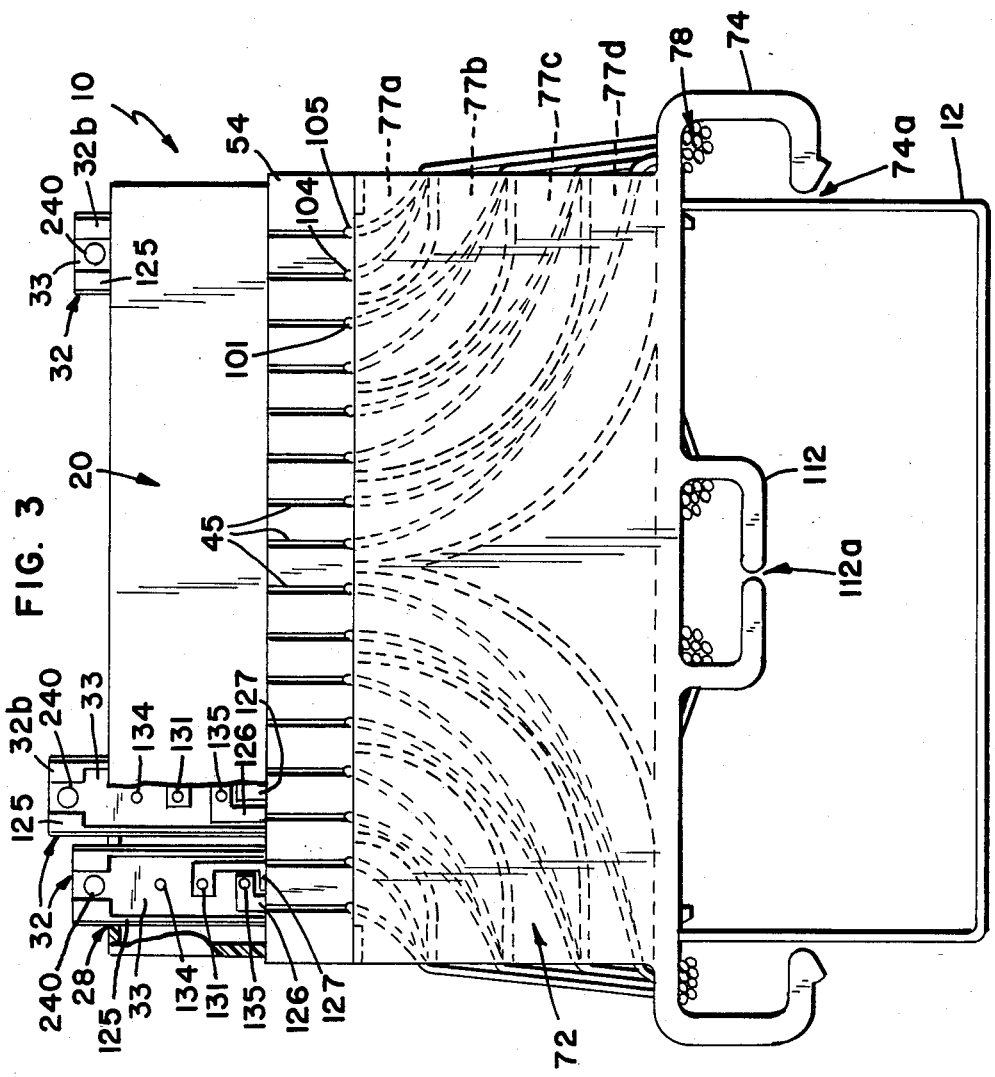
FIG. 3 is an end view of a module assembled to a bracket showing the wire guide feature of one module face.

Extending along one face of module body 54 is connecting wire guide 72, which is preferably molded integrally with body 54. Connecting wire guide 72 is basically a rectangular structure which is used to guide wires, as best seen in FIG. 3, in the ends of module 20 and up to a particular pair of insulation displacement terminals. In FIG. 3 there are identified, for example, passageways 77a, 77b, 77c, and 77d. In use, wires 78 from equipment to module body 54 initially pass through a equipment wire guide 74, which is an extension of body 54 into which wires may be slid through space 74a, then through one of closed rectangular section passageways 77a–d to one of the connectors 46. Each passageway is typically capable, in the embodiment shown, of handling up to four connecting wires, and has a portion which runs horizontally and a radiused bend portion which gently directs the wire upwardly toward the connectors. For each connector mounted in body 54, there is provided a coaxially-extending guide and strain-relief slots 45, running opposite the "split" in each split cylinder connector, such that wires may be connected to a connector by insertion into an aperture 44, down into a connector 46, and extending outwardly through a slot 45 into a wire guide passageway.

Figure 2:
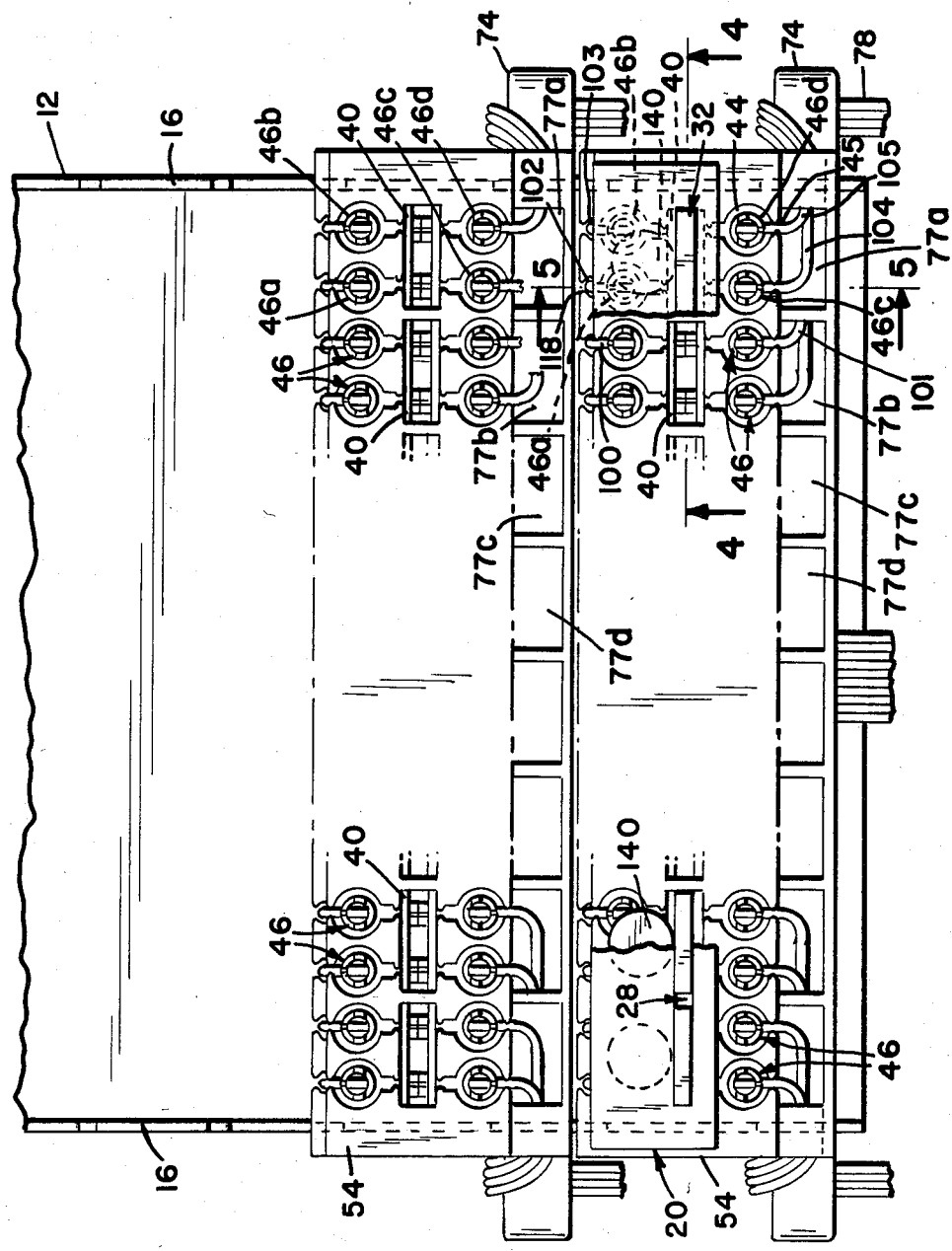
FIG. 2 is an enlarged plan view of two modules assembled to a bracket side-by-side.
Figure 5:
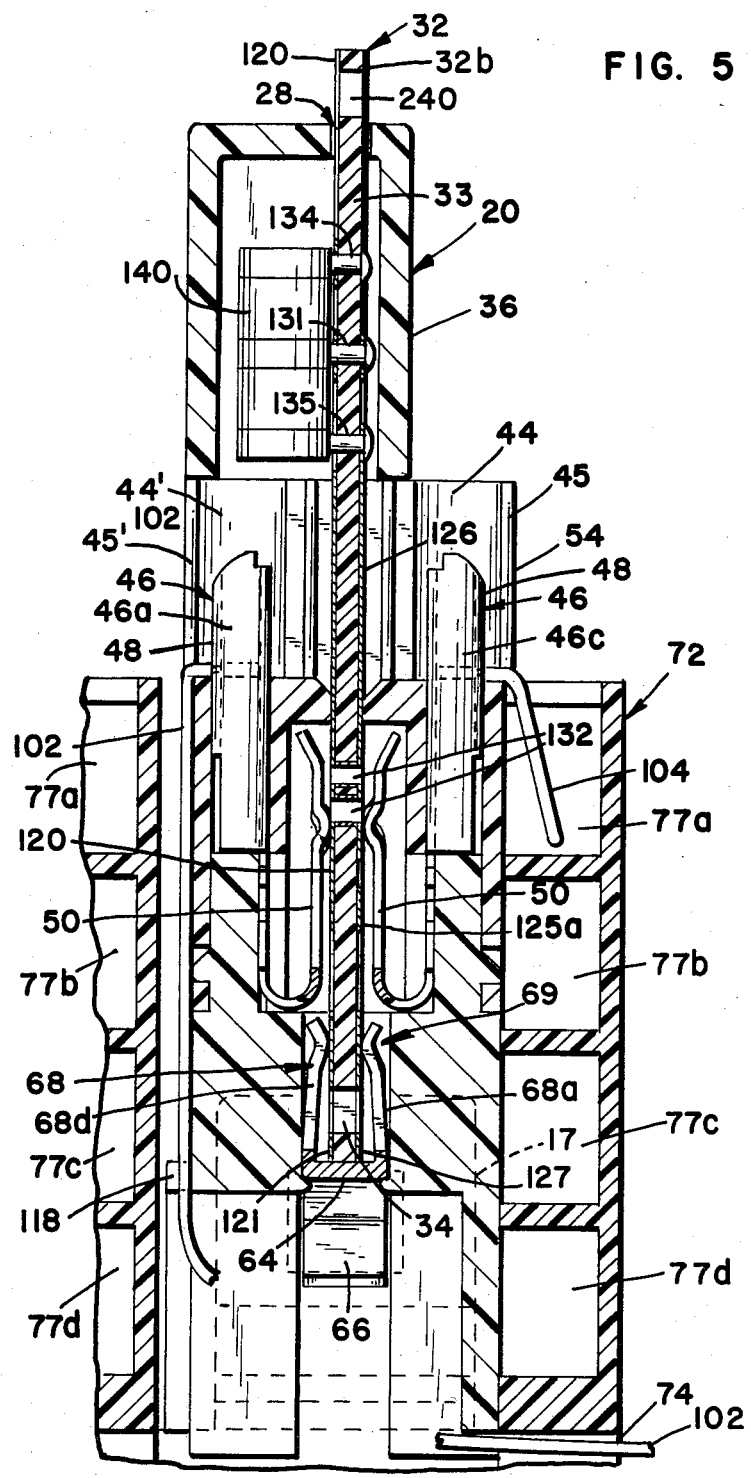
FIG. 5 is an enlarged sectional view taken along the lines 5—5 of FIG. 2.

Referring now to FIGS. 2 and 5, the reverse side of module body 54 will be described. As may be best seen in FIG. 5, module body 54 is generally symmetrical about its longitudinal axis, excepting the wire guide facial portions thereof. Thus, each displacement connector on the reverse side includes an opposing strain relief and guide slot, an example of which is labeled 45'. Instead of a wire guide 72 like that shown with respect to the other side, however, the reverse side includes instead an individual wire guide groove 118 for each connector thereon. Each groove extends from immediately below a corresponding slot (45') along the reverse side of body 54 to the base or near the base thereof, from where they would typically be routed through line conductor guide 112, which includes opening or gap 112a through which individual wires may be slipped. As will be described in more detail below, in typical use line conductors would pass through guide 112 and up through grooves 118 for connection to the split cylinder connectors.

As may be seen best with reference to FIG. 2, a module 20 includes a plurality of apertures 40, each of which is associated with four individual apertures 44 and corresponding connectors 46. One pair of connectors 46 accepts connecting wires from a passageway in wire guide 72, while the opposite pair accepts wires from wire guide grooves 118. In use, it is contemplated that wire to be connected would be guided through one or the other sets of guideways on one of the sides of module 20 through the strain relief slots (45,45'), and across the tops of split cylinder connectors 46. A connection tool which can be used to perform a simultaneous cut-off, insulation displacement and connection function with respect to each of the wires captivated by the individual strain relief slots, would then complete assembly.

As may be seen with reference to FIG. 2, and wires 100 and 101, wires connected to opposing connectors 46 in aperture 40, and which no protector element is inserted, make electrical contact through the corresponding connector spring fingers 50. This operation may also be understood with reference to FIG. 5, imagining that protector element 32 has been removed, such that spring fingers 50 spring toward and make contact with each other. Thus, where distribution lines do not need to be protected, protector elements 32 may be omitted, thereby a direct connection from incoming lines to equipment may be made through opposing pairs of connectors 46.

Where protection from over-voltage or over-current conditions on incoming lines is desired, the protector element 32, one particular embodiment of which is shown in FIGS. 4, 5, 6, and 7, would be disposed in the aperture 40 corresponding to the line pair sought to be protected. As seen best with reference to FIGS. 5, 6, and 7, protector element 32 consists of a printed circuit board element 33, including opposing sides 32a and 32b, each plated with a different conductor pattern. Side 32a includes three conductor platings 120, 121 and 122, while side 32b includes platings 125, 126, 127, 128 and 129. Conductors or contacts 120 and 129, 121 and 127, and 122 and 126 are electrically connected together (shorted) via the respective platedthrough holes 130, 131 and 132.

Module 32 further includes, as shown in FIG. 5, an overload protection device, in particular a gas overvoltage protection element of conventional type, which may be a gas discharge element 140. In the embodiment of element 32 shown in FIGS. 4 through 7, the element 140 is provided to sense over-voltage conditions present on conductors 120 (128) and 122 (126) and shunt the conductor to ground connector 121 or 127 in the case of over-voltage. The connection of the various conductors of element 32 to particular connectors 46 will be described in more detail below. If the over-voltage continues for an extended time, element 140 heats up until an insulated wire shunt (not shown) becomes active, at which point the insulation on the shunt melts and creates an alternate path to ground to avoid excessive heating of element 140. The individual portions of elements 140 which need to be connected to contacts on printed circuit board 33 are typically soldered in place connections, and the printed circuit board contacts used provide an effective and inexpensive way of manufacturing a protector circuit with the desired contact configuration. The contact configuration can, of course, readily be changed merely using an alternate printed circuit board, as will be demonstrated below with respect to the alternate embodiments illustrated in FIGS. 9–13.

With reference now more particularly to FIGS. 4 and 5, the mechanical and electrical interface between protector element 32 and a group of four connectors 46 disposed in an aperture 44 will be explained. In solid lines in FIG. 4 and in FIG. 5, one protector element 32 is shown in a fully-inserted normal operating position wherein it provides protection for equipment lines 104 and 105 from over-voltage on the respective incoming lines 102 and 103. More specifically, protector element 32 as shown is disposed between connectors 46a and 46b and 46c and 46d, and is connected to those connectors as follows. When fully inserted, connector 42a is in contact with contact 122 and in turn contact 126, which is in contact with the spring fingers of connector 46c. Thus, an electrical connection is made between connectors 46a and 46c, with over-voltage protection provided via element 140 from conductor 126 to ground conductors for contacts 121 and 127, which as best seen in FIG. 5, are each in contact with a grounding clip 68, which in turn is in electrical contact with frame 12 via locking apertures 24. Of course, frame 12 would be electrically connected to a suitable ground.

Similarly, insulation displacement connectors 46b and 46d are connected via printed circuit conductors 120 and 128, with conductor 120 providing an over-voltage protection path through element 140 to ground plates 121 and 127. Thus, in a normal, fully-inserted mode of operation, protector element 32 provides for electrical contact between opposing connectors in a module 20, and for over-voltage protection also. In addition, however, protector element 32 also provides a pair of readily accessible test points corresponding to each connection, i.e. conductors 120 and 122, which extend to the top of protector element 32 on side 32a thereof. As may be seen with reference to FIG. 5, this uppermost portion of protector element 32 extends above cover element 36, which would normally cover and shield the upper portion of protector element 32, and the over-voltage element 140 extending above module body 54. Thus, when protector element 32 is fully inserted in the normal operating mode, it provides a readily accessible test point corresponding to each distribution and equipment line pair connected therethrough.

In a second mode of operation protector element 32 may be shifted slightly upwardly, as indicated by the phantom lines shown at the top of FIG. 4 in order to provide for "break access" testing. This testing procedure, as it is typically understood in the art, provides for a break in the circuit, i.e. between incoming lines and equipment lines, as part of the testing of equipment or the condition of a distribution line. For the purpose of positioning protector element 32 for break access testing, the element is provided with a notch 34 which when protector element 32 is pulled upwardly, is engaged at the bottom edge thereof by the grounding clips cooperating therewith. In this position (not shown for the sake of brevity in the drawing), ground conductors 121 and 127 remain in ground connection with grounding strip 64, but the connection between opposing connectors 46 is broken. For instance, in the example discussed immediately above, the connection between connectors 46a and 46c, and 46b and 46d would be broken, because connectors 46c and 46d (in particular their spring fingers 50) shift out of contact with the respective conductors 126 and 128 and into contact with conductors 125 and 129 respectively. However, the distribution line side 32a of protector element 32 will continue to contact the respective distribution line connectors 46a and 46b, via conductors 122 and 120 respectively, as those contact extend downwardly further than their corresponding contacts 126 and 128. Thus, the distribution lines coming into connectors 46a and 46b remain connected to over-voltage protection element 140, to provide for the safety of personnel performing tests. With respect to the testing, it will be readily seen that in the break access mode or position, element 32 provides individual test point for each conductor connected to a connector interfaced therewith, with all four test points being provided at the very accessible top edge thereof on either side. Accordingly, the protector element 32 provides for highly convenient test point access while at the same time performing the important function of over-voltage protection whereby the likelihood of serious injury by electrocution and equipment damage is greatly diminished.

Referring now to FIGS. 9, 10 and 11, there is shown an alternate embodiment of a protector element 32'. Protector element 32' operates in a similar manner to element 32 but includes, in addition to over-voltage protection as provided by element 140', current fuses 200 and 201 and bipolar Zener diodes 204 and 205. This 5-point protective scheme provides for both over-voltage protection and for over-current protection.

With respect to the plated conductors on element 32', a first side 32a' includes plated conductors 210, 211 and 212, while side 32b' includes conductors 215, 216, 217, 218, 219 and 220. Conductors pairs 210 and 218, and 211 and 217 are connected directly together through apertures in circuit card. As may be seen best with reference to FIG. 11, which is an electrical schematic of protector element 32', connector 210 is connected through a current fuse 201 to conductor 219, conductor 219 through bipolar diode 204 to conductors 211 and 217, conductor 216 through bipolar diode 205 to conductors 211 and 217, and conductor 212 to conductor 216 through current fuse 200, while conductor 218 connects conductor 210 through element 140', with conductor 212 connected on its other side and the ground connection made through conductors 211 and 217.

Thus, protector 32' provides a 5-point protector which when fully inserted in a module 20 provides both overvoltage and over-current protection. In addition, protector element 32' provides the test-point functions as described above with respect to alternate embodiment 32, both with respect to in-line testing and break access testing, including the overload protection in the break access mode.

Figure 14:
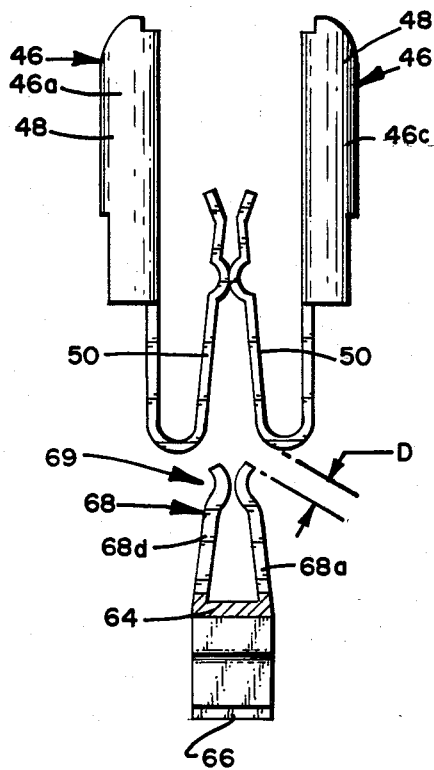
FIG. 14 is a view taken in elevation showing connector elements in spatial relation to a grounding clip.
Figure 5:
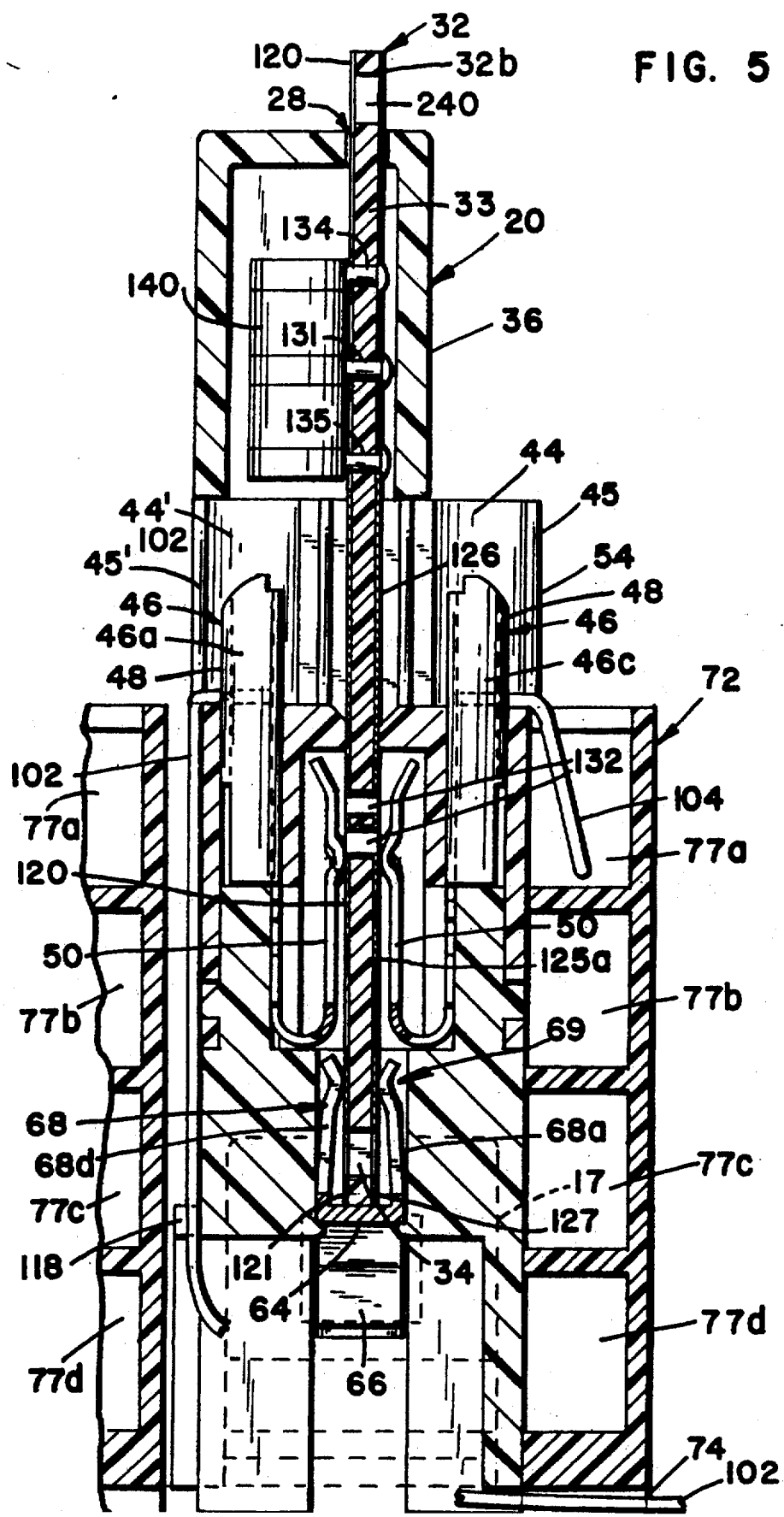

The apparatus also has a secondary overvoltage protection element which can be best illustrated with reference to FIG. 14. In FIG. 14, connectors 46a and 46c with their spring contacts 50 are shown as is the grounding clip 68. As shown in FIG. 14, the protector 32 is removed and spring contacts 50 are in direct mechanical and electrical connection. As shown in all the drawings, and illustrated most clearly in FIG. 14, grounding clip 68 is maintained by the module body 54 in closely spaced proximity to the connectors. Specifically, free ends of grounding clip 68a are maintained in a predetermined spacing from the nearest surface of spring contact 50. This spacing is shown as space D in FIG. 14. By maintaining the grounding clip in this closely spaced position and controlling the dimension of space D, a secondary overvoltage protection is provided. When a high voltage potential (for example, 3000–5000 volts) exists between the nearest opposing surfaces of spring contact 50 and clip 68a, the gap D will break down through ionization and the voltage will be conducted across the gap to ground. As a result, the air gap in the block provides some basic protection for lines which otherwise would not be protected with protector modules. Also, the gap acts as a back-up protection where the protector modules 32 are used. By varying the dimension D of the gap, the overvoltage protection provided by the close proximity between the clip 68 and connectors 46 can be varied. In a preferred embodiment, the gap will be dimensioned to approximately 0.060 inches to give overvoltage protection of approximately 3000–5000 volts.

Figure 12:
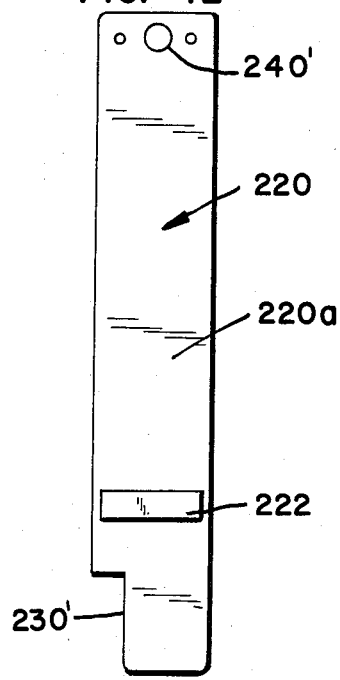
FIGS. 12 and 13 are corresponding side elevations showing either side of a protector elements according to yet another embodiment of the present invention.
Figure 13:
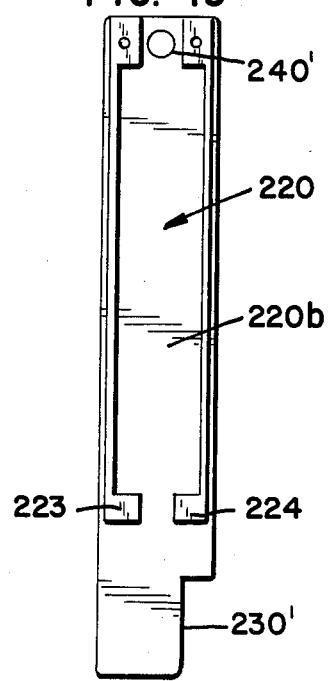

Referring finally to FIGS. 12 and 13, there is shown a test element 220 including first and second sides 220a and 220b including their respective conductors 222, 223, and 224. Element 220, when inserted into an aperture 40, provides a connection break from the incoming distribution lines, and provides test-point access to each of the equipment side conductors contacting contacts 223 and 224. In addition, the distribution line side conductors are grounded together via plated contact 222.

Figure 6:
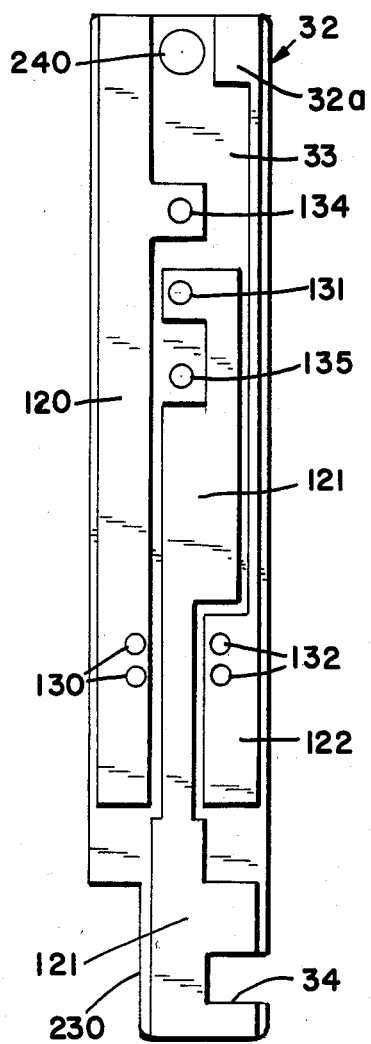
FIGS. 6 and 7 are corresponding side elevations showing either side of a printed circuit board protector element according to one embodiment of the present invention.
Figure 7:
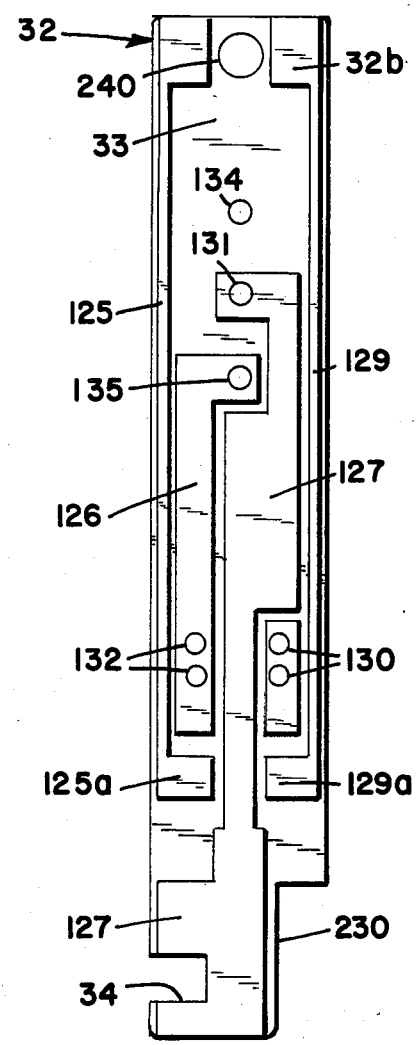

Finally, with respect to elements 32, 32' and 220, it will be noted that each is provided with a key notch, identified for example with respect to FIGS. 6 and 7, as notch 230, which cooperates with key guides 235 which are included near the bottom of each aperture 40, as may be seen best with respect to FIG. 4, in order to insure the proper orientation of the elements therein. Each of the elements, 32, 32' and 220, also include a top center aperture as identified with respect to element 32 as aperture 240. Aperture 240 provides a convenient means by which an element may be hooked and pulled out of a module, or raised up into the break access testing position.

Although the present invention has been described above in a preferred form, those skilled in the art will readily appreciate that various modifications may be made to it without departing from the spirit and scope of the invention, as bounded only by the claims of the application itself.

What is claimed is:

1. A distribution frame module, comprising:
    (a) a generally rectangular module block having a front face, said module including first and second parallel opposing rows of wire connectors supported therein and connector apertures in said front face through which individual wire connectors may be accessed for terminating wires, said module further including a row of protector apertures disposed between said first and second wire connector rows, said protector apertures for accepting overload protector elements;
    (b) said wire connectors each having a wire terminating end and a spring contact finger end, the spring contact finger end of corresponding opposing connectors extending into one of said protector apertures, said finger ends of opposing connectors resiliently biased into making electrical connection between said opposing connectors; and
    (c) a protector element having a first end sized to extend into a protector aperture and separate opposing spring fingers, said element having at least two external contacts each for making contact with one of said spring fingers, and circuitry means carried on said element for connecting said external contacts in electrical connection when said protector element is disposed in a first position with said first end disposed between and separating said opposing spring fingers.

2. Apparatus according to claim 1 wherein said protector element includes at least one external probe contact located at the non-inserted end of said element, said probe contacts in electrical communication with at least one of said external contacts so that test and monitoring access to lines in electrical communication with said external contacts may be had via the non-inserted end of said element.

3. Apparatus according to claim 2 wherein said protector element includes near the inserted end thereof a notch which may provide a key to a second less than fully inserted position in which at least one of said spring fingers is moved out of contact with one of said two external contacts whereby said electrical connection between wire connectors is broken, and wherein said element includes an additional contact for contacting said moved out of contact spring finger, and a probe contact accessible at the non-inserted end of said protector in electrical communication with said additional contact whereby break access testing may be performed via said non-inserted end of said element.

4. Apparatus according to claim 3 wherein said element includes overvoltage protection means connected between one of said external contacts and a ground, and wherein said protection means remains effective on an outside line connected to said external contact when said protector element is in either of said positions.

5. Apparatus according to claim 4 wherein said module includes a ground strip disposed along the bottom thereof, said strip including ground clips disposed at the bottom of said protector apertures for clipping onto the inserted end of a protector element mounted therein and wherein said protector element includes contacts in electrical communication with said ground clips when said element is clipped in an aperture, whereby protector ground may be provided to each individual protector element disposed in a module.

6. A distribution frame module for electrically connecting a first set of conductors with a second set of conductors, comprising:
(a) a first plurality of wire connectors (46);
(b) means for electrically and mechanically connecting conductors of said first set with connectors of said first plurality;
(c) a second plurality of wire connectors (46);
(d) means for electrically and mechanically connecting conductors of said second set with connectors of said second plurality;
(e) contact members (50) secured to each of said connectors (46) with contact members of opposing connectors resiliently biased into electrical and mechanical contact;
(f) a protector (32) having separating means (33) sized to be removably disposed between opposing contact members (50) to electrically and mechanically separate said opposing connectors (46) against urging of said bias; and
(g) said protector (32) having circuitry means for making electrical connection between said connectors (46) of said first and second pluralities when said opposing contact members (50) are separated by said separating means (33) with said separating means disposed in a first predetermined position between said opposing contact members (50).

7. A module according to claim 6, wherein said circuitry means includes an overload protector means (200) for opening said electrical connection between said connectors (46) when electrical current in said circuitry means exceeds a predetermined maximum.

8. A module according to claim 6, comprising a grounded electrical contact, said circuitry means including first overvoltage protector means (140) for connecting a wire connector of said first plurality with said grounded electrical contact when a first overvoltage condition exists at said wire connector.

9. A module according to claim 8, comprising a second overvoltage protector including a grounded electrical contact (68) and means for supporting said grounded electrical contact in closely spaced proximity to a wire connector (46) of said first plurality and with said grounded contact spaced from said wire connector (46) a predetermined distance for current to arc from said connector (46) to said grounded contact (68) when a second overvoltage condition exists.

10. A module according to claim 6, comprising an overvoltage protector including a grounded electrical contact (68) and means for supporting said grounded electrical contact (68) in closely spaced proximity to a wire connector (46) of said first plurality and with said grounded contact spaced from said wire connector a predetermined distance for current to arc from said connector to said grounded contact when an overvoltage condition exists.

11. A module according to claim 6, wherein said protector has an access location remote from said opposing contact members when said separator means is disposed between said opposing contact members, electrical contact points on said access location and in electrical communication with said circuitry means whereby test and monitoring access may be made.

12. A distribution module according to claim 6, comprising means for holding said separating means in a second predetermined position with said protector breaking electrical connection between said opposing connectors.

13. A distribution module for electrically connecting a first set of ungrounded conductors with a second set of ungrounded conductors, comprising:
(a) a module block;
(b) a first plurality of wire connectors;
(c) means for securing said connectors of said first plurality to said block;
(d) means for electrically and mechanically connecting ungrounded connectors of said first set with connectors of said first plurality;
(e) a second plurality of wire connectors;
(f) means for securing connectors of said second plurality to said block;
(g) means for electrically and mechanically connecting conductors of said second set with connectors of said second plurality;
(h) contact members secured to each of said connectors with members of opposing connectors resiliently biased into electrical and mechanical contact;
(i) an overvoltage protector including a grounded electrical contact and means for supporting said grounded electrical contact in closely spaced proximity to a wire connector of said first plurality and with said grounded contact spaced from said wire connector a predetermined distance for current to arc from said connector to said grounded contact when an overvoltage condition exists.

* * * * *

REEXAMINATION CERTIFICATE (1520th)
United States Patent [19]
Singer, Jr.

[11] B1 4,741,711
[45] Certificate Issued  Jul. 30, 1991

[54] MODULAR DISTRIBUTION FRAME INCLUDING PROTECTOR MODULES ADAPTED FOR BREAK ACCESS TESTING

[75] Inventor: Loren A. Singer, Jr., Minneapolis, Minn.

[73] Assignee: ADC Telecommunications Inc.

Reexamination Request:
No. 90/002,239, Dec. 24, 1990

Reexamination Certificate for:
Patent No.: 4,741,711
Issued: May 3, 1988
Appl. No.: 917,232
Filed: Oct. 6, 1986

Related U.S. Application Data

[63] Continuation-in-part of Ser. No. 740,804, Jun. 3, 1985, abandoned.

[51] Int. Cl.$^5$ .............................................. H01R 13/06
[52] U.S. Cl. ................................... 439/620; 361/119; 439/92
[58] Field of Search ................................. 439/620–622

[56] References Cited

U.S. PATENT DOCUMENTS

| | | | |
|---|---|---|---|
| 4,281,885 | 8/1981 | Forberg et al. | 339/14 R |
| 4,283,103 | 8/1981 | Forberg et al. | 339/59 M |
| 4,345,294 | 8/1982 | Forberg et al. | 361/119 |
| 4,410,225 | 10/1983 | Stoewe et al. | 339/31 R |
| 4,420,792 | 12/1983 | Hegner et al. | 361/331 |
| 4,541,682 | 9/1985 | Gerke et al. | 339/111 |
| 4,634,209 | 1/1987 | Forberg et al. | 339/147 |
| 4,682,838 | 7/1987 | Achtnig et al. | 439/598 |

FOREIGN PATENT DOCUMENTS

3212013C2 9/1984 Fed. Rep. of Germany .
7604482 9/1977 France .

OTHER PUBLICATIONS

Description and Installation, Technical Practices Bulletin, C-102.006, Publication Issue 6, Sep. 1980.

*Primary Examiner*—Eugene F. Desmond

[57] ABSTRACT

A modular distribution frame is disclosed which includes a module block having first and second parallel opposing rows of wire connectors. Apertures in the block provide access to the connectors. The wire connectors have a wire terminating end and a spring contact finger end. The spring contact finger end of opposing connectors extend into the apertures in releasable electrical contact. An overload protector element is provided adaptable for insertion into the aperture and extending between opposing spring fingers to electrically separate the fingers. The overload protector element includes circuitry to provide electrical connection between the opposing wire connectors through the element.

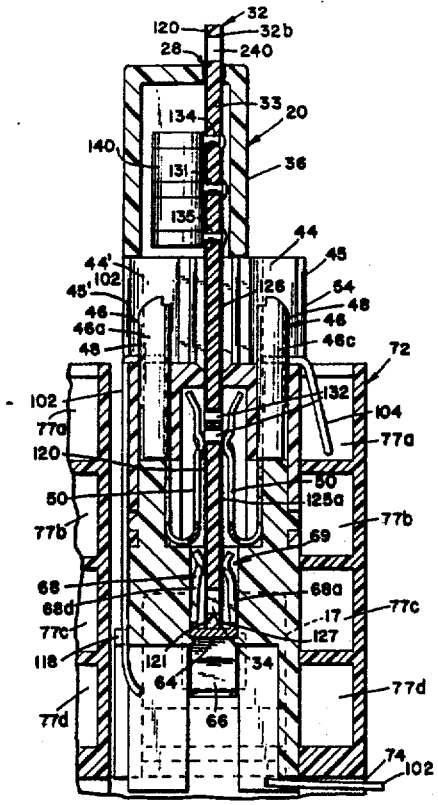

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-13 is confirmed.

* * * * *

REEXAMINATION CERTIFICATE (1814th)
United States Patent [19]
Singer, Jr.

[11] B1 4,741,711
[45] Certificate Issued Oct. 20, 1992

[54] MODULAR DISTRIBUTION FRAME INCLUDING PROTECTOR MODULES ADAPTED FOR BREAK ACCESS TESTING

[75] Inventor: Loren A. Singer, Jr., Minneapolis, Minn.

[73] Assignee: ADC Telecommunications Inc., Minneapolis, Minn.

Reexamination Request:
No. 90/002,373, Jun. 21, 1991

Reexamination Certificate for:
Patent No.: 4,741,711
Issued: May 3, 1988
Appl. No.: 917,232
Filed: Oct. 6, 1986

Related U.S. Application Data

[63] Continuation-in-part of Ser. No. 740,804, Jun. 3, 1985, abandoned.

[51] Int. Cl.$^5$ .......................................... H01R 13/66
[52] U.S. Cl. ..................................... 439/620; 361/119; 439/92

[56] References Cited

U.S. PATENT DOCUMENTS

| | | | |
|---|---|---|---|
| 3,778,750 | 12/1973 | Caveny et al. | 439/392 |
| 4,087,151 | 5/1978 | Robert et al. | 339/176 |
| 4,146,755 | 3/1979 | Caussé | 361/119 X |
| 4,150,867 | 6/1979 | Knickerbocker | 439/406 |
| 4,163,596 | 8/1979 | Aysta et al. | 439/405 |
| 4,210,370 | 7/1980 | Vachhani et al. | 303/108 |
| 4,236,778 | 12/1980 | Hughes et al. | 439/406 |
| 4,255,009 | 3/1981 | Clark | 439/398 |
| 4,281,855 | 8/1981 | Forberg et al. | 339/14 R |
| 4,283,103 | 8/1981 | Forberg et al. | 339/59 M |
| 4,283,105 | 8/1981 | Ferrill et al. | 439/406 |
| 4,286,836 | 9/1981 | Rumps | 439/406 |
| 4,345,294 | 8/1982 | Forberg et al. | 361/119 |
| 4,363,941 | 12/1982 | Nelson | 200/292 |
| 4,410,225 | 10/1983 | Stoewe et al. | 339/31 R |
| 4,420,792 | 12/1983 | Hegner et al. | 361/331 |
| 4,541,682 | 9/1985 | Gerke et al. | 339/111 |
| 4,634,209 | 1/1987 | Forberg et al. | 339/147 |
| 4,682,838 | 7/1987 | Achtnig et al. | 439/598 |

FOREIGN PATENT DOCUMENTS

3212013C2 8/1984 Fed. Rep. of Germany.
7604482 9/1977 France.

OTHER PUBLICATIONS

Description and Installation, Technical Practices Bulletin, C-102.006, Publication Issue 6, Sep. 1980.
"MDF: Planning & Engineering Guidelines", Bell System, Aug. 1976.

*Primary Examiner*—Eugene F. Desmond

[57] ABSTRACT

A modular distribution frame is disclosed which includes a module block having first and second parallel opposing rows of wire connectors. Apertures in the block provide access to the connectors. The wire connectors have a wire terminating end and a spring contact finger end. The spring contact finger end of opposing connectors extend into the apertures in releasable electrical contact. An overload protector element is provided adaptable for insertion into the aperture and extending between opposing spring fingers to electrically separate the fingers. The overload protector element includes circuitry to provide electrical connection between the opposing wire connectors through the element.

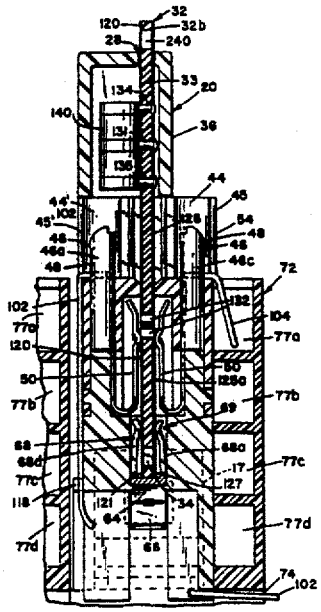

B1 4,741,711

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 6, 7, 11, 12 and 13 are cancelled.

Claims 3, 8 and 10 are determined to be patentable as amended.

Claims 4, 5 and 9, dependent on an amended claim, are determined to be patentable.

New claims 14-19 are added and determined to be patentable.

3. [Apparatus according to claim 2 wherein] *A distribution frame module, comprising:*
 (a) *a generally rectangular module block having a front face, said module including first and second parallel opposing rows of wire connectors supported therein and connector apertures in said front face through which individual wire connectors may be accessed for terminating wires, said module further including a row of protector apertures disposed between said first and second wire connector rows, said protector apertures for accepting protector elements;*
 (b) *said wire connectors each having a wire terminating end and a spring contact finger end, the spring contact finger end of corresponding opposing connectors extending into one of said protector apertures, said finger ends of opposing connectors resiliently biased into making electrical connection between said opposing connectors; and*
 (c) *a protector element having a first end sized to extend into a protector aperture and separate opposing spring fingers, said element having at least two external contacts each for making contact with one of said spring fingers, and circuitry means carried on said element for connecting said external contacts in electrical connection when said protector element is disposed in a first position with said first end disposed between and separating said opposing spring fingers;*
 *said protector element including at least one external probe contact located at the non-inserted end of said element, said probe contacts in electrical communication with at least one of said external contacts so that test and monitoring access to lines in electrical communication with said external contacts may be had via the non-inserted end of said element; and*
 said protector element [includes] *further including* near the inserted end thereof a notch which may provide a key to a second or less than fully inserted position in which at least one of said spring fingers is moved out of contact with one of said two external contacts whereby [said] *an* electrical connection between wire connectors is broken, and wherein said element includes an additional contact for contacting said moved out of contact spring finger, and a probe contact accessible at the non-inserted end of said protector in electrical communication with said additional contact whereby break access testing may be performed via said non-inserted end of said element.

8. [A module according to claim 6, comprising] *A distribution frame module for electrically connecting a first set of conductors with a second set of conductors, comprising:*
 (a) *a first plurality of wire connectors (46);*
 (b) *means for electrically and mechanically connecting conductors of said first set with connectors of said first plurality;*
 (c) *a second plurality of wire connectors (46);*
 (d) *means for electrically and mechanically connecting conductors of said second set with connectors of said second plurality;*
 (e) *contact members (50) secured to each of said connectors (46) with contact members of opposing connectors resiliently biased into electrical and mechanical contact;*
 (f) *a protector (32) having separating means (33) terminating at a distal end, said separating means (33) sized to be removably inserted between opposing contact members (50) to electrically and mechanically separate said opposing connectors (46) against urging of said bias and with said distal end extending past said contact members;*
 (g) *said protector (32) having circuitry means for making electrical connection between said connectors (46) of said first and second pluralities when said opposing contact members (50) are separated by said separating means (33) with said separating means disposed in a first predetermined position between said opposing contact members (50); and*
 a grounded electrical contact *positioned to be in mechanical and electrical contact with said distal end when said separating means is disposed in said first predetermined position,* said circuitry means including first over-voltage protector means (140) for connecting a wire connector of said first plurality with said grounded electrical contact *through said distal end* when said first over-voltage condition exists at said wire connector.

10. [A module according to claim 6, comprising] *A distribution frame module for electrically connecting a first set of conductors with a second set of conductors, comprising:*
 (a) *a first plurality of wire connectors (46);*
 (b) *means for electrically and mechanically connecting conductors of said first set with connectors of said first plurality;*
 (c) *a second plurality of wire connectors (46);*
 (d) *means for electrically and mechanically connecting conductors of said second set with connectors of said second plurality;*
 (e) *contact members (50) secured to each of said connectors (46) with contact members of opposing connectors resiliently biased into electrical and mechanical contact;*
 (f) *a protector (32) having separating means (33) sized to be removably disposed between opposing contact members (50) to electrically and mechanically separate said opposing connectors (46) against urging of said bias;*

(g) said protector (32) having circuitry means for making electrical connection between said connectors (46) of said first and second pluralities when said opposing contact members (50) are separated by said separating means (33) with said separating means disposed in a first predetermined position between said opposing contact members (50); and an over-voltage protector including a grounded electrical contact (68) [and] in electrical communication with said circuitry when said protector is in said first predetermined position, means for supporting said grounded electrical contact (68) in closely spaced proximity to a wire connector (46) of said first plurality and with said grounded contact spaced from said wire connector a predetermined distance for current to arc from said connector to said grounded contact when an over-voltage condition exists.

14. A distribution module comprising:
(a) a module block;
(b) a first row of wire connectors supported within said block;
(c) a second row of wire connectors supported within said block;
(d) means for electrically and mechanically connecting a first set of conductors to said wire connectors of said first row;
(e) means for electrically and mechanically connecting a second set of conductors to said wire connectors of said second row;
(f) a first plurality of contact members connected to each of said connectors of said first row;
(g) a second plurality of contact members connected to each of said connectors of said second row;
(h) said contact members of said first and second plurality disposed for a first contact member of said first plurality to be resiliently biased into mechanical and electrical contact at a normally closed and normally ungrounded point of contact with a second contact member of said second plurality;
(i) a plurality of apertures in said block member disposed to expose each of said points of contact;
(j) a protector having separating means with an insert end sized to be removably inserted into at least one of said apertures and extend through said point of contact to electrically and mechanically separate said first and second connectors against an urging of said bias when said protector is inserted to a predetermined first position;
(k) said protector having circuitry means including first and second exposed contacts for electrically connecting with said separated first and second connectors, respectively, when said protector is in said first predetermined position, said protector further having a third exposed contact at said insert end;
(l) a common ground contact carried on said block on a side of said point of contact opposite said aperture and disposed to be releasably engaged by said insert end when said protector is in said first predetermined position, with said third exposed contact in electrical communication with said ground contact;
(m) said circuitry means including means for normally electrically connecting said first and second exposed contacts and further including an over-voltage protector for diverting current from at least one of said first and second exposed contacts to said third exposed contact when a first over-voltage condition exists.

15. A distribution module according to claim 14 wherein said ground contact is disposed in closely spaced proximity to said connectors of at least said first row, said closely spaced proximity sized for current to arc from said connectors of said at least first row to said grounded contact when a second over-voltage condition exists.

16. A distribution module according to claim 14 comprising a plurality of individual protectors each separately insertable and removable into one of said apertures to separate distinct pairs of opposing contact members at each of said points of contact.

17. A distribution module according to claim 14 wherein said protector includes an accessible plurality of electrically contacts on an end thereof opposite said insert end, said plurality including a contact connected to said first exposed contact and a contact connected to said second exposed contact to permit access testing of said first and second sets of conductors when said protector is in at least said first predetermined position.

18. A distribution module according to claim 14 including means for holding said separating means in a second predetermined position and said circuitry means includes means for electrically connecting first contact members to ground and with said second contact members ungrounded and electrically disconnected from said first contact.

19. A distribution module comprising:
(a) a module block;
(b) a first row of wire connectors supported within said block;
(c) a second row of wire connectors supported within said block;
(d) means for electrically and mechanically connecting a first set of conductors to said wire connectors of said first row;
(e) means for electrically and mechanically connecting a second set of conductors to said wire connectors of said second row;
(f) a first plurality of contact members connected to each of said connectors of said first row;
(g) a second plurality of contact members connected to each of said connectors of said second row;
(h) said contact members of said first and second plurality disposed for a first contact member of said first plurality to be resiliently biased into mechanical and electrical contact at a normally closed and normally ungrounded point of contact with a second contact member of said second plurality;
(i) a plurality of apertures in said block member disposed to expose each of said points of contact;
(j) a plurality of individual protectors each having independently movable separating means having an insert end sized to be removably inserted into one of said apertures and extend through said point of contact to electrically and mechanically separate said first and second connectors against an urging of said bias when said separator means is inserted to a predetermined first position;
(k) each of said protectors having circuitry means including first and second exposed contacts for electrically connecting with said separated first and second connectors, respectively, when said protector is in said first predetermined position, said protector further having a third exposed contact;
(l) a ground contact disposed to be releasably engaged by said third exposed contact when said protector is in said first predetermined position, with said third exposed contact in electrical communication with said ground contact;
(m) each of said circuitry means including means for normally electrically connecting said first and second exposed contacts and further including an over-voltage protector for diverting current from at least one of said first and second exposed contacts to said third exposed contact when a first over-voltage condition exists.

* * * * *